United States Patent [19]
Billingsley

[11] Patent Number: 5,136,455
[45] Date of Patent: Aug. 4, 1992

[54] ELECTROMAGNETIC INTERFERENCE SUPPRESSION DEVICE

[75] Inventor: Richard J. Billingsley, North Vancouver, Canada

[73] Assignee: ESP Electronic Systems Protection, Inc., North Vancouver, Canada

[21] Appl. No.: 494,535

[22] Filed: Mar. 16, 1990

[51] Int. Cl.[5] ............................................. H02H 9/00
[52] U.S. Cl. ...................... 361/56; 361/111; 361/118
[58] Field of Search ............... 361/56, 118, 111, 129, 361/127

[56] References Cited

U.S. PATENT DOCUMENTS

| | | | |
|---|---|---|---|
| 3,771,022 | 11/1973 | Isokawa | 317/52 |
| 4,455,586 | 6/1984 | McCartney | 361/56 |
| 4,563,720 | 1/1986 | Clark | 361/56 |
| 4,586,104 | 4/1986 | Standler | 361/91 |
| 4,628,394 | 12/1986 | Crosby | 361/56 |
| 4,630,163 | 12/1986 | Cooper et al. | 361/56 |
| 4,677,518 | 6/1987 | Hershfield | 361/56 |
| 4,683,514 | 7/1987 | Cook | 361/91 |
| 4,758,920 | 7/1988 | McCartney | 361/119 |
| 4,760,485 | 7/1988 | Ari et al. | 361/54 |
| 4,901,183 | 2/1990 | Lee | 361/56 |

OTHER PUBLICATIONS

"IEEE Guide for Surge Voltages in Low Voltage AC Power Circuits", IEEE Power Engineering Society, IEEE Std. 587-1980, Approved Dec. 19, 1979.

*Primary Examiner*—Steven L. Stephan
*Assistant Examiner*—Adolf Berhane
*Attorney, Agent, or Firm*—Kevin F. O'Brien

[57] ABSTRACT

A multi-stage electromagnetic interference suppression circuit is disclosed which utilizes a diverter network, an impedance network and a clamping network. The diverter network includes a series combination of a varistor and a three terminal gas arrester to suppress incoming transient energy in both normal and common propagation modes. The clamping network serves to suppress any transient energy overshoot which is not suppressed by the diverter stage. Radio frequency interference is filtered by X and Y capacitors forming LC filters with an inductance in the impedance network.

19 Claims, 6 Drawing Sheets

SCALE

VERTICAL
1000 VOLTS/DIV

HORIZONTAL
1000 μS/DIV

SCALE

VERTICAL
200 V/DIV

HORIZONTAL
100 μS/DIV

SCALE

VERTICAL
200 V/DIV

HORIZONTAL
100 μS/DIV

SCALE
SAME AS FIG. 6

SCALE
SAME AS FIG. 6

SCALE
SAME AS FIG. 6

SCALE

SAME AS

5,136,455

ELECTROMAGNETIC INTERFERENCE SUPPRESSION DEVICE

FIELD OF THE INVENTION

The invention relates generally to suppressors of conducted electromagnetic interference, and in particular to multi-stage hybrid circuits which attenuate radio frequency interference and transient overvoltages from the power distribution network.

BACKGROUND OF THE INVENTION

Research and development in the field of electronic equipment has emphasized the miniaturization of circuitry through the integration of discrete semiconductor components. Other areas of emphasis have included the development of circuitry utilizing higher clock speeds and baud rates to reduce semiconductor processing times. While these developments have led to smaller, more efficient and less expensive products, it has also resulted in products much more susceptible to disruption and damage from conducted electromagnetic interference (EMI) delivered by the AC power distribution network. The most visible impact of these trends is the proliferation of electronic, and particularly, microprocessor based equipment which now populates the power distribution network, nearly all of which is susceptible to the harmful effects of EMI.

An undesirable by-product of this rapid expansion in the use of electronic equipment is that the equipment itself is a source of EMI on the AC power network. This introduction of EMI to the AC network has become particularly acute with the expanded use of the switch mode power supply. Since it is clear that these trends will continue in the future, it is likely that the conducted EMI problem on the AC power distribution network will soon reach epidemic proportions.

Conducted EMI has many sources and thus takes a variety of shapes and forms. Typically, however, EMI is divided into two categories; radio frequency interference (RFI), which describes repetitive interference, and transients, which describe singular, short duration overvoltage conditions.

The sources of RFI range from radio communication systems, which can result in high frequency common mode interference (line-ground and neutral-ground propagation paths), to switch mode power supplies which generate high frequency normal mode interference (line-neutral propagation paths). A spectral analysis of the sources of RFI suggests that the lower limit of this interference is at approximately 30 KHz in the normal and common mode. Further, since the AC distribution network is a three conductor system having distributed resistance, inductance and capacitance, it has been found that the network exhibits a prominent low pass filter characteristic, resulting in an upper limit for AC main conducted RFI of approximately 30 MHz. Thus the spectral occupation of conducted RFI is typically in the 30 KHz to 30 MHz band. In view of this characteristic, the FCC and VDE have set limits on the conducted RFI emissions from digital electronic equipment which is to be connected to the power distribution network. These limits become stringent typically from 150 KHz to 30 MHz.

The effectiveness of RFI suppression networks can be tested in several ways. A test which has become the industry standard is the 50 ohm insertion loss test which is normally conducted through the use of a spectrum analyzer and tracking generator designed to operate over the frequency range in question. In this case the frequency band between 30 KHz and 30 MHz. The result of this test is an attenuation curve of the device being tested throughout the desired frequency range.

Conducted transients can be produced in the common mode by natural sources such as lightning strikes or in the normal mode by the switching action of large inductive loads. As would be expected from these varied sources, transients occurring in the power distribution network are widely varied with respect to both amplitude and duration, and thus, energy content. The exact characteristic of any given transient is a function of many variables, including the source of the transient as well as the characteristics of the distribution network itself.

In order to provide a testing standard for a reasonable worst case transient occurrence, the Institute of Electrical and Electronic Engineers (IEEE) has developed standardized test waveforms for various electrical environments. For indoor environments, the worst case transient condition is designated as the IEEE 587 Category B impulse waveform, defined in the 1980 IEEE publication "IEEE Guide for Surge Voltages in Low-Voltage AC Power Circuits". This impulse waveform, shown in FIG. 5, represents a worst-case waveform which is recommended for use in the testing of transient overvoltage protection circuitry. The standardization of this test waveform allows reproducible testing of transient protection devices.

The effects of the conducted EMI discussed above on electronic equipment connected to the power distribution network range from the disruption of normal operation to the damage of electronic components and circuits. Although EMI susceptibility levels vary as widely as do electronic equipment types, the trends in electronic equipment design have led to lower EMI tolerance levels and thus, a much more universal problem.

DESCRIPTION OF THE PRIOR ART

In addressing the problems associated with conducted EMI, the prior art has taken a number of approaches. These approaches can generally be categorized into three types: EMI filters which utilize an array of passive components; transient voltage surge suppressors which are designed around non-linear devices; and, hybrid circuits which are a combination of both the EMI filters and transient voltage surge suppressor circuitry.

EMI filters utilize passive inductive, capacitive and resistive (LCR) components in single and multi-order normal and common mode low pass filters. When properly designed, this technology is effective in suppressing normal and common mode RFI in the critical 30 KHz to 30 MHz frequency band. However, LCR networks are ineffective in dealing with the wide variety of transient types, particularly the long duration waveforms such as the worst-case condition described in the IEEE 587 standard. A major deficiency in the prior art utilizing filter technology has been in providing significant suppression in both the normal and common propagation modes throughout the 30 KHz to 30 MHz frequency band. A device of this type is disclosed in U.S. Pat. No. 4,761,623. There, a multi-stage broadband RFI power line filter is disclosed which utilizes an array of passive devices which form an LCR filtering circuit.

Transient voltage surge suppressors utilize non-linear devices such as varistors, gas arresters and silicon avalanche diodes which are relatively non-conductive at normal signal levels but which become conductive in response to an overvoltage condition. These devices are used in single and multi-stage networks and can be effective in reducing normal and common mode transients. However, prior art devices have been deficient in providing sufficiently low clamp levels to protect equipment from the variety of normal and common mode transient overvoltages which occur on the AC distribution network. Further, these devices are ineffective in the filtering of RFI. Prior art devices of this type are disclosed in U.S. Pat. Nos. 4,739,436 and 4,089,032.

To overcome the disadvantages and limitations of separate EMI filter networks and transient voltage surge suppressors, hybrid circuits have been developed which incorporate both technologies. These hybrid devices are effective in both the filtering of RFI as well as the suppression of transients, and come in simple, single stage designs as well as multi-stage designs incorporating many filtering and suppression components. With the wide variety of conducted EMI, it is necessary to utilize many component types with different electrical characteristics to suppress all modes of this conducted interference to levels safely below the susceptibility levels of modern electronic equipment. Beyond the LCR filtering networks which are common to most prior art designs, there are generally three types of non-linear components used to suppress transient overvoltages; varistors, gas arresters, and avalanche diodes.

The most common of these, varistors, are semiconductor clamping components which have a response time of approximately 25 nanoseconds and can withstand a typical $8 \times 20$ microsecond surge current of about 6500 amps. A significant problem with varistors is the tendency of the devices to degrade in performance over time when subjected to repeated transients. This can lead to unacceptable levels of leakage current through these devices when the circuit is operating at normal power levels.

Gas arresters have a relatively slower response time than varistors, often on the order of 0.5 microseconds. However, they are capable of handling much higher levels of surge current, typically an $8 \times 20$ microsecond surge of 10,000 amps or more. The main problem with the use of gas arresters in transient suppression circuitry is the slow response time of the devices which can allow significant transient energy to "pass" the device prior to its reaching the conductive state. In AC Main applications, the shorting characteristic of the gas arrester can also produce power follow problems. This significant problem generally limits their use across AC Mains.

Silicon avalanche diodes are semiconductor clamping devices which have much faster response times than either varistors or gas arresters, with a typical response time on the order of several picoseconds. However, single devices are capable of withstanding only about 25 amps of $8 \times 20$ microsecond surge current. They are therefore inappropriate for use in circuit arrangements where they would be subjected to transient energy levels such as those contained in the IEEE 587 waveforms.

As shown, each of these devices has unique electrical characteristics. When combinations of these devices in hybrid circuits effectively utilize the advantages of each, relatively effective transient suppression circuitry can be developed. That suppression, coupled with effective filtering circuitry, yields a device which can efficiently suppress a wide variety of EMI. The major deficiency in the prior art utilizing the hybrid concept has been in its failure to provide a durable, low cost design which can suppress all modes of RFI and transients to acceptable levels.

Typical prior art hybrid designs utilize at least one diverter stage, an impedance filtering network and at least one clamping stage to suppress EMI. The diverter stage generally utilizes high energy components such as varistors and gas arresters. The purpose of the diverter stage is to absorb a majority of the energy contained in an incoming transient by diverting transient current back to the transient source. The energy absorption must be accomplished within the diverter stage without its components being themselves damaged, and also without having any detrimental effect on the desired power signal. The diverter stage must absorb enough transient energy so that the second stage clamping elements are subjected to energy levels within their maximum ratings. Absorbing as much transient energy as possible in the diverter stage also results in lower bias current levels in the clamping stage, resulting in lower overall clamping levels.

A major deficiency in prior art designs is that the diverter stages are not capable of absorbing enough of the energy contained in transients such as the IEEE 587 category B impulse to allow the use of economical silicon avalanche diodes in the clamping stage. Two stage suppressors which utilize a diverter stage that can withstand and absorb a large percentage of AC main transients have the advantage of allowing only low transient levels to the clamping stage, thus allowing the use of avalanche diode components which yield fast response times and low transient clamp levels in an inexpensive device.

Most of the prior art designs utilize only varistor components in the diverter stage, usually in the form of three varistors connected line-neutral, line-ground and neutral-ground. Varistors arranged in this configuration must be rated safely above the operating line voltage to ensure, first, that the desired power signal is in no way effected by their presence across the mains, and second, that leakage current levels are within UL and CSA acceptable levels.

There are two main deficiencies in devices which utilize only varistors in the diverter stage. First, varistors have a tendency to degrade in performance after repeated transients, resulting in a downward shift in the component conduction point. This results in higher steady state leakage current levels. The second major problem in the use of varistor only configurations in the diverter stage is the suppression levels which can be achieved. In a typical prior art arrangement, a varistor such as a model S20K130 is used across each pair of mains. This device is capable of achieving suppression of the IEEE 587 Category B impulse to only about the 500 volt level, which would be inadequate diverter stage suppression in a two-stage design utilizing silicon avalanche diodes in the clamping stage. Examples of prior art designs which utilize diverter stages of this type are disclosed in U.S. Pat. Nos. 4,630,163, 4,675,772, 4,563,720 and 4,628,394.

Another type of prior art design utilizes gas arrester technology across the AC mains to reduce incoming transient energy to levels lower than can be achieved with varistors. These designs take advantage of the "crowbar" characteristics of gas arresters which essentially makes the gas arresters behave as a transient activated switch. These devices change from a nearly perfect open circuit characteristic to a near short circuit characteristic in response to transient voltage conditions which exceed the device's predetermined conduction point. The conduction point of the devices in this arrangement are chosen to be at a level higher than the peak operating voltage, approximately 170 volts in the US standard, so that the devices will not change to the "short" condition under steady state voltage conditions. A major problem with this type of design is that the shorting action not only shorts transient energy but also the desired power signal. This condition is called power follow, and it is usually enough to cause the gas arrester to remain in the short state after the transient has subsided, often through half a cycle of the power signal. This results in the AC power source, which has a relatively small source impedance, producing follow currents as high as 500 amps or more. These currents are high enough to trip line breakers, thus shutting down all equipment sharing the branch circuit. Prior art patents which disclose the use of gas arresters in this type of configuration include U.S. Pat. Nos. 4,758,920, 4,683,514, 3,793,535 and 4,586,104.

A solution to the problems associated with varistor only or gas arrester only diverter stages is to use these two devices in series across the mains. When properly configured, this design allows the use of a lower breakover voltage varistor which can result in much lower transient voltage clamp levels as well as lower steady state leakage levels than can be achieved in varistor-only designs. Further, when properly designed, these circuits can also resolve the problems associated with the power follow phenomenon in gas arrester-only designs. U.S. Pat. Nos. 4,455,586 and 4,677,518 reveal suppression circuits which utilize the series combination of a gas arrester and a varistor.

The overall solution to the EMI problem is a circuit which is capable of suppressing all transients and noise to levels which can be tolerated by todays electronic equipment. The transient protection must have a response time fast enough to protect the equipment from the fast rising transients and be able to suppress high energy transients such as the IEEE 587 Category B impulse to acceptable levels. The circuit should also utilize a minimal number of components to control EMI in both common and normal propagation modes which results in a low cost solution to the problem. Further, the device should be long lasting, economical and maintain a minimal leakage current level in the safety ground conductor even after being subjected to many high transient energy conditions.

SUMMARY OF THE INVENTION

A circuit for controlling transient energy and for controlling radio frequency interference includes line, neutral and ground input terminals for connection to a power source and line, neutral and ground output terminals for connection to a load. A diverter network is connected to the input terminals for suppressing transient energy appearing at the input terminals, and includes a gas arrester and a varistor in series between the line and neutral input terminals and between the line and ground input terminals. A clamping network connected to the output terminals suppresses any overshoot of transient energy which is not suppressed by the diverter network, and includes silicon avalanche diodes in series between the line and neutral output terminals and between the line and ground output terminals. A filtering network is connected to the diverter and clamping networks for limiting the passage of radio frequency interference through the circuit.

It is a primary object of the invention to provide a circuit which is effective at suppressing all types of electromagnetic interference (EMI) in both the normal and common propagation modes.

It is a further object of this invention to achieve highly efficient suppression in a device which is both durable and economical.

Another object of the invention is to provide a device which will maintain its performance characteristics over a long period, will not degrade in performance due to the frequent suppression of transients, and will continue to meet all pertinent safety standards, such as those of Underwriter's Laboratories, even after repeated transient occurrences.

A still further object of the invention is to provide a device which minimizes the number of circuit components necessary to maintain adequate EMI levels for electronic equipment.

Another object of the invention is to provide an EMI surge suppression diverter stage which results in a transient clamp level of approximately 300 volts peak.

An advantage of the invention is that it minimizes the number of circuit components necessary to suppress EMI in both normal and common propagation modes.

A further advantage of the invention is that transient voltage surges such as the IEEE 587 Category B impulse can be clamped in a single, two component diverter stage to levels of approximately 300 volts peak.

A feature of the invention is that it can withstand in excess of 1000 IEEE 587 Category B unipolar transients without failure.

Another feature of the invention is that leakage current from the device is minimized.

A further feature of the invention is that several pieces of electronic equipment can be attached at its output and all those devices will be equally protected from the harmful effects of source originated EMI.

Other objects, advantages and features of the invention will become more fully apparent from the following description of the preferred embodiments, the accompanying drawing figures and the appended claims.

DESCRIPTION OF THE PREFERRED EMBODIMENTS

Figure 1:
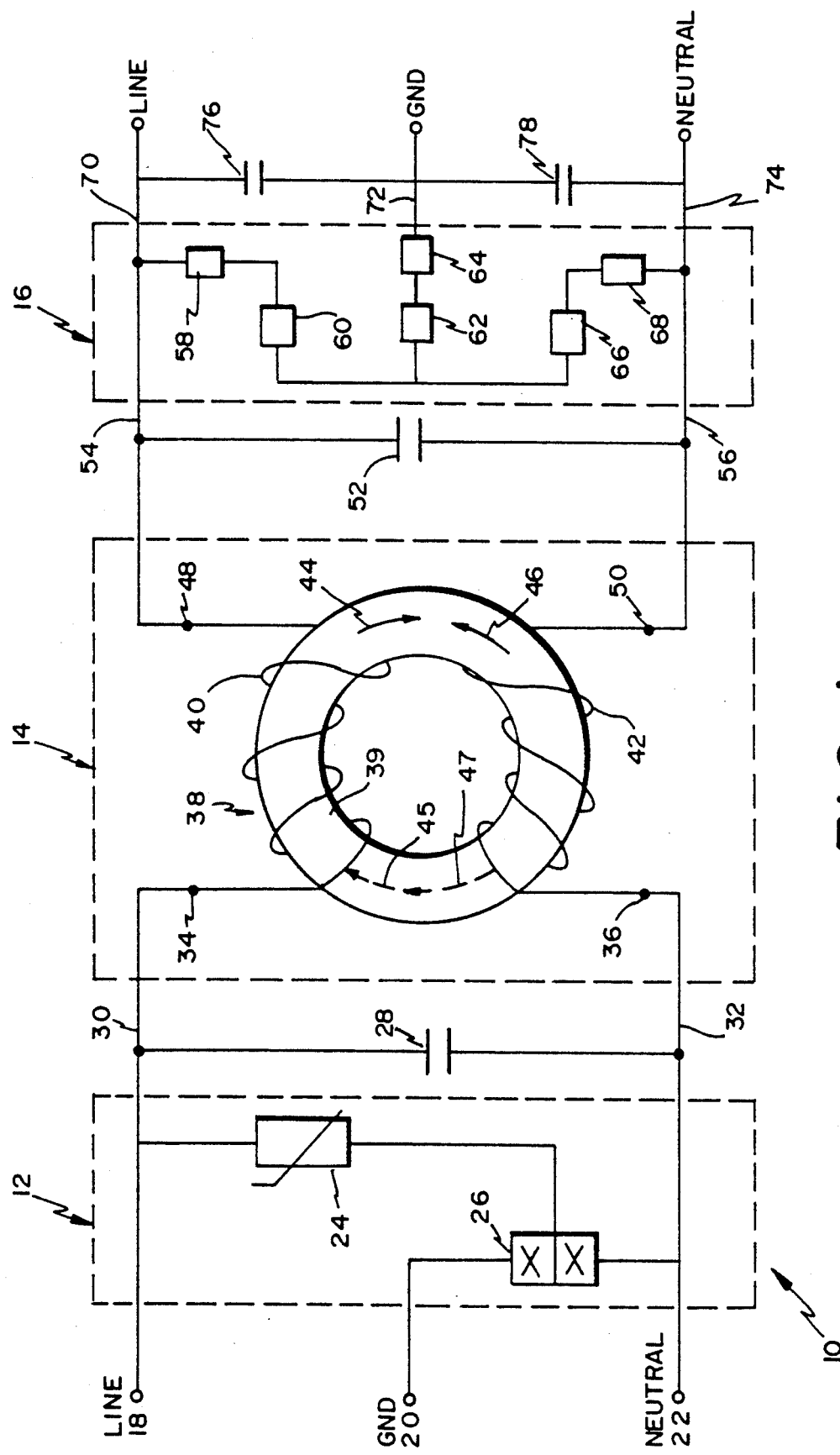
FIG. 1 is a detailed schematic drawing of the preferred embodiment of the EMI suppression device of the present invention.

A preferred embodiment of the EMI suppression device of the invention, designated generally at 10, is shown in FIG. 1. The device 10 includes a diverter network 12, an impedance network 14 and a clamping network 16. In the preferred embodiment, the input to the device is a single phase, three wire AC junction having a line input 18, a safety ground 20 and a neutral return conductor 22. In the preferred embodiment the input and output junctions of the device would be via a standard male plug and cord (not shown) and one or more standard three prong outlets (not shown), respectively.

The diverter network 12 acts as the primary circuit protection in that it diverts the majority of the incoming transient current between any two pairs of lines 18, 20 and 22 away from the clamping network 16. The clamping network 16 then serves to further reduce the transient energy by clamping any overshoot which may result from the relatively slow response time of the diverter network 12. The clamping network 16 also further reduces any residual transient energy to levels that are within the transient limits of the protected equipment. Between the diverter network 12 and the clamping network 16, the impedance network 14 is included to force the bulk of the transient energy to be absorbed into the diverter network 12 and also to limit the residual transient energy to levels that can be absorbed without damage by the clamping network 16. The impedance network 14 has a very high impedance with respect to undesired transient frequencies and very low impedance with respect to desired power signal frequencies, typically 60 Hz.

Referring now in more detail to FIG. 1, the three input lines 18, 20 and 22 from the AC wall outlet enter the diverter portion 12 of the device 10. The diverter 12 includes a varistor 24 and a three terminal gas arrester 26. The varistor is preferably a metal oxide varistor, such as model S10V S20K60 manufactured by Siemens. This device is capable of clamping transient overvoltages such as the IEEE 587 category B unipolar transient to levels of about 300 V and has an average response time on the order of 25 nanoseconds. The gas arrester 26 is a two-in-one type such as model number 3YVP2-30A manufactured by Sankosha. This device has a response time of up to approximately 0.5 microseconds and is capable of clamping the IEEE 587 category B unipolar transient, after a brief overshoot of several hundred volts, to levels of about 30 V.

The two output lines 30 and 32 of the diverter 12 are fed to the impedance network 14 across a parallel X2 capacitor 28. In a preferred embodiment the capacitor 28 is a type such as model PME271M660 manufactured by Evox/Rifa and having a value of 0.68 microfarads.

The lines 30 and 32 make a junction with the impedance network 14 at connections 34 and 36. Impedance network 14 includes a balun wound toroidal core inductor 38. As shown in FIG. 1, this inductor is formed by two windings 40 and 42 of equivalent turns of magnet wire on a magnetic toroidal core 39 in a balun configuration. The windings 40 and 42 are preferably wound on a very high permeability ferrite core so that a large inductance is achieved with very few magnet wire turns, resulting in very low copper losses and a high steady state efficiency.

The output junctions 48 and 50 of the impedance network 14 are coupled to the clamping network 16 across a parallel X2 capacitor 52 via a pair of lines 54 and 56. In a preferred embodiment the capacitor 52 is identical to X2 capacitor 28.

The clamping stage 16 includes six silicon avalanche diodes 58, 60, 62, 64, 66 and 68 of a type such as model 1.5KE56CA manufactured by General Semiconductor Industries. These devices have a response time as low as 1 picosecond.

Output lines 70, 72 and 74 of clamping stage 16 correspond to the device outputs line, ground and neutral, respectively. In the preferred embodiment, these device outputs would be in the form of at least one standard three prong female plug. It is of course understood that several of these plugs could be connected in parallel to provide multiple output plugs for the device. For reasons to be discussed more fully hereinafter, a Y capacitor 76 is connected across lines 70 and 72. Likewise, Y capacitor 78 is connected across lines 72 and 74. These Y capacitors 76 and 78 are preferably of a type such as model PME271Y410 manufactured by Evox/Rifa and having a nominal rating of 0.0047 microfarads.

Referring now in more detail to the diverter stage 12, the main function of the diverter stage 12 is to absorb a majority of any transient energy which appears between any pair of input lines 18, 20 and 22 away from the clamping stage 16. In order to divert most of the surge current contained in these high level transients back to the source, the series combination of varistor 24 and arrester 26 is utilized. Since the varistor 24 and arrester 26 are in series, the relatively slow response time of the arrester 26, which can be as high as 0.5 microseconds, dictates that this circuit can be used only as primary protection. As will be discussed more fully hereinafter, the drawback of utilizing the gas arrester technology in the diverter stage 12 is overcome by the picosecond response time of the clamping stage 16 which is capable of attenuating the transient energy contained in the overshoot not absorbed in the diverter stage due to the relatively slow response time of the gas arrester.

With this series configuration of the varistor 24 and gas arrester 26 across the AC mains, the steady state characteristic of the diverter stage is directly related to the characteristics of the gas arrester 26. Within normal operating voltages, the gas arrester 26 is in the non-conducting, open circuit state and leakage levels to the ground conductor 20 are minimal. The S10V S20K60 varistor 24 has a breakover voltage of approximately 100 volts peak at 1 milliamp while the gas arrester 26 conduction voltage is approximately 230 volts peak. Since these two devices are operating in series, the aggregate conduction voltage of the series circuit is approximately 330 volts, though testing indicates that the conduction voltage may be as high as 400 volts due to the non-linear statistical nature of the gas arrester 26. The circuit thus appears as a low breakover voltage varistor in series with a switch across the AC mains, with the switch being open in steady state conditions. Therefore, even though the varistor breakover voltage is much lower than the operating line voltage, the amount of leakage produced is much lower than that of diverter designs which use only higher breakover voltage varistors. A further benefit of this design is that the varistor can in fact degrade from repeated transients and yet the steady state leakage current levels will remain relatively constant, since this leakage current is dependent on the characteristics of the gas arrester.

When a transient occurs that exceeds the level of the sum of the breakover voltages of the varistor 24 and gas arrester 26, the gas arrester 26 will, within 0.5 microseconds, form a short circuit. Once the shorting has occurred, the voltage clamping levels of the circuit behave in a manner like that of the varistor. Typically, this clamp level will be approximately 300 volts peak. This suppression performance is far superior, by approximately 40%, than a single S20K130 type varistor connected across the mains.

The circuit arrangement in the diverter network 12 is also very effective in preventing the power follow problems normally associated with the use of gas arrester devices across the AC mains. In terms of the power follow problem, a worst case situation occurs with a transient at or near the 170 volt peak of the operating voltage. As the transient is subsiding, the clamp voltage of the varistor 24 begins to fall. A critical voltage level at the varistor 24 occurs when the current levels through the varistor 24 and gas arrester 26 are at approximately 100 milliamps. At this current level, the gas arrester 26 moves from its shorted arc mode to the glow mode, the first stage in turning off the device. In order to complete the transition of the gas arrester 26 from the short state to the open state, the varistor clamp voltage at 100 milliamps, when subtracted from the peak voltage of 170 volts, must be less than the gas arrester arc voltage. In the diverter 12 of the invention, the varistor 24 has a clamp voltage of 150 volts peak at a current level of 100 milliamps. The voltage across the gas arrester 26 is thus approximately 20 volts peak (170−150), which is less than the rated arc voltage of the device, and the gas arrester 26 turns off or opens. Therefore, the gas arrester 26 will be turned off regardless of the location of the transient in the power signal voltage, and no power follow problems will be encountered.

The diverter stage 12 is able to achieve this superior normal and common mode performance, with only two components, through the use of the three terminal gas arrester 26. As can be seen in FIG. 1, the varistor 24 and gas arrester 26 form a series circuit between both line and neutral, and line and ground. In the series circuit connected between neutral and ground, the three terminal gas arrester 26 provides essentially two gas arresters on that branch. The action of the varistor 24 described above in reference to line to neutral and line to ground transients is not necessary across the neutral and ground lines since the steady state voltage between the neutral and ground conductors will typically not exceed two to three volts.

Referring now in more detail to the impedance stage 14, lines 30 and 32 provide circuit flow from the diverter stage 12, across X capacitor 28, to the impedance stage 14. A normal mode LC filtering circuit is formed by the inductive windings 40 and 42 on toroidal core 39 and capacitors 28 and 52. The windings 40 and 42 interact in a way that the magnetic fields in the core are cancelled by power signal currents as well as normal mode interference currents. The cancelling action of these normal mode currents are shown in FIG. 1 at 44 and 46, respectively. This field cancellation results in a relatively low normal mode inductance of about 50 $\mu$H. Since the impedance of an inductor is linearly proportional to the frequency of the applied signal, given by the equation $Z=2*pi*f*L$ where f is the frequency of the applied signal and L is the inductance, the impedance of the inductance to signal currents is very low, about 0.02 ohms. This low impedance to 60 Hz signal currents results in a high steady state efficiency. At typical transient and noise frequencies, the impedance of the impedance network to normal mode currents is about 20 or more times larger than its impedance value at signal frequency. This higher impedance provided by the impedance network provides for normal mode transient and RFI isolation between the diverter and clamping networks. This is an important characteristic in providing improved normal mode interference suppression levels as well as providing transient protection to the clamping network by limiting the transient energy to this network.

Common mode interference currents, shown as dashed lines 45 and 47, cause the magnetic fields to add, thus producing a large common mode inductance. The inductor 38 in the preferred embodiment produces a common mode inductance of approximately 5 mH per winding. This large inductance value produces a very large impedance, according to the above equation, to common mode interference currents. The result of this large common mode impedance is to provide a large amount of isolation in this mode between the diverter and clamping networks, which results in improved interference suppression and transient protection to the clamping network by limiting common mode transient energy passage to this network. Further, the single layer windings minimize the undesired interwinding capacitance by minimizing the voltage difference between successive windings. This single layer balun wound configuration, on a high permeability core, results in a low impedance to the desired signal frequency while at the same time providing significant impedance to normal mode interference frequencies and a very large impedance to common mode interference frequencies.

The clamping stage 16 serves several purposes. First, due to the rapid response times of the silicon diodes, it is capable of clamping any transient overshoot which has bypassed the diverter stage before that harmful energy can be delivered to the load. Second, the clamping stage is capable of quickly clamping any transients which may occur at the load, such as spikes caused by catastrophic equipment failures and noisy equipment such as printers, so that those spikes are not introduced into the source network.

The circuit of the invention utilizes a clamping stage having four low breakover voltage silicon avalanche diodes in each propagation path, unlike many prior art devices which utilize a single diode for each propagation path. The advantage of this arrangement is that a diode with a lower breakover and clamping voltage can withstand more transient current flow, according to the relationship $P=V*I$. Silicon avalanche diodes are grouped into categories according to the peak transient power that they can withstand. For example, the 1.5 KE series of silicon avalanche diodes can withstand 1500 watts of peak transient power with respect to a 1000 microsecond duration transient waveform. A standard diode component that is used in the prior art is the 1.5KE220CA which has an initial breakover point of about 185 volt peak, so it suitable with 120 volt RMS line voltages, and has a maximum clamp level of about 328 volt peak. According to the equation $P = V*I$ it can therefore withstand about 4.6 amps of 1000 microsecond transient current. To produce a device that is suitable in 120 volt RMS applications but can withstand more transient surge current and thus more transient energy, a procedure known as component stacking is used. For example, two 1.5KE110CA components could be connected in series with the combination providing an initial breakover point of about 188 volts peak and a maximum clamp level of about 304 volts peak, or approximately 152 volts peak per component. Since the power rating of each component is 1500 W and each component has a maximum clamp level of 152 volts peak the maximum transient current that the combination can handle is now increased to about 9.9 amps with respect to a 1000 microsecond duration waveform. The maximum surge current and energy withstand capability of this combination is therefore approximately twice as high as that of a single component. Utilizing this component stacking procedure in all modes as shown in the preferred embodiment of FIG. 1 produces a clamping stage 16 capable of clamping significantly higher transient energy levels than circuits utilizing single avalanche diodes.

An important feature of the invention is that while there ar four diodes in series across the lines in all three propagation modes, only six diodes are required to accomplish that result. This reduction in component count results not only in cost efficiencies but also allows more compact and less cluttered circuitry.

Figure 2:
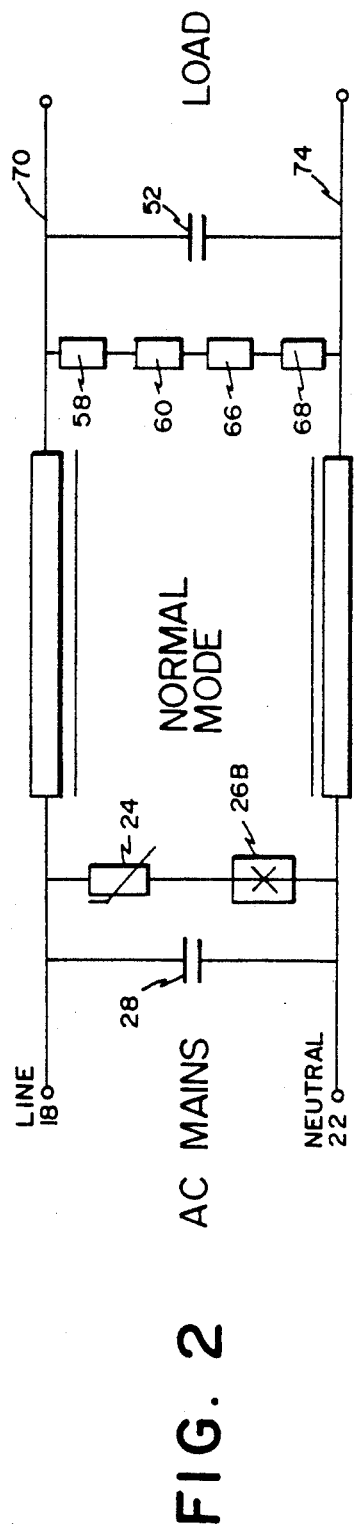
FIG. 2 is a simplified schematic drawing of the circuit of FIG. 1 showing the circuit configuration in the line-neutral or normal propagation mode.
Figure 3:
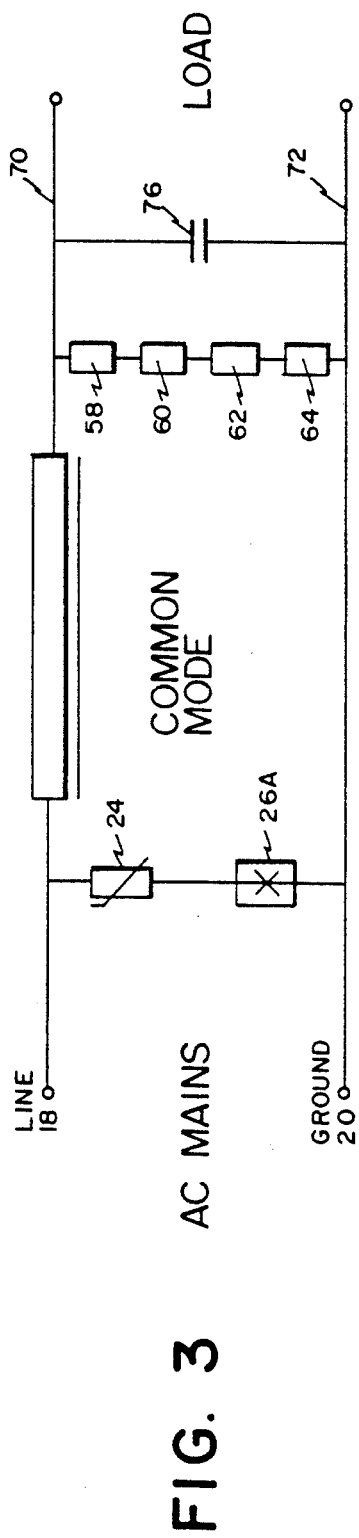
FIG. 3 is simplified schematic drawing of the circuit of FIG. 1 showing the circuit configuration in the line-ground common propagation mode.
Figure 4:
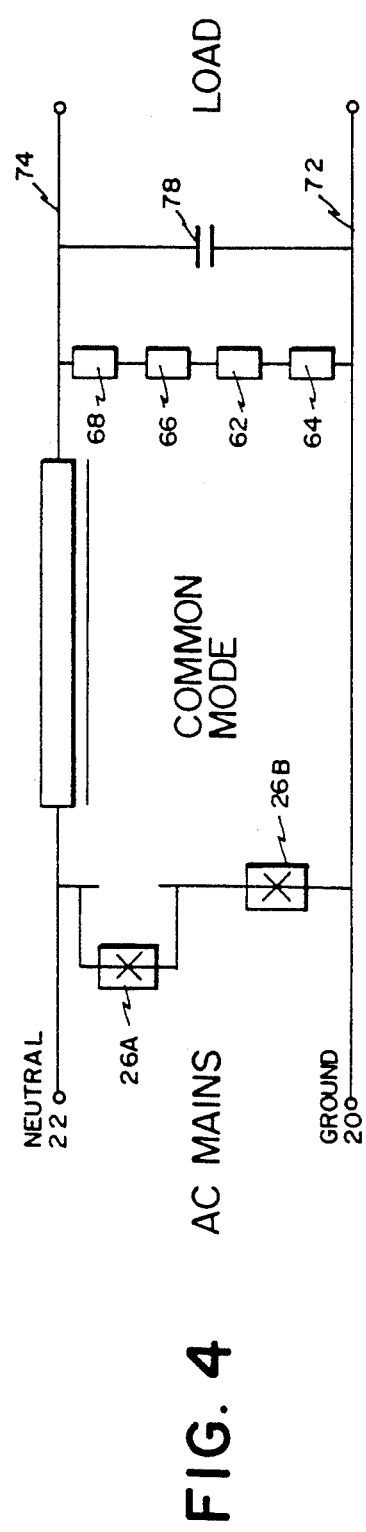
FIG. 4 is a simplified schematic drawing of the circuit of FIG. 1 showing the circuit configuration in the neutral-ground common propagation mode.

Referring now to FIGS. 2-4, simplified schematics of FIG. 1 are shown which illustrate the three possible transient propagation paths through the EMI suppression device of the invention.

FIG. 2 illustrates in simplified fashion the normal mode propagation path through the circuit. When the circuit is operating in a steady state condition, the power signal will originate at the input lines 18 and 22, flow through the inductor 38 and continue to the load via lines 70 and 74. Under steady state conditions, the diverter stage 12 and clamping stage 16 appear as open circuits to the signal flow since the threshold voltage of the non-linear devices in those branches has not been reached.

Under these normal mode conditions, the inductor 38 has a nominal inductance of 0.05 mH due the magnetic field cancelling action of the normal current flow, as depicted by lines 44 and 46 at FIG. 1. As is most clearly seen in FIG. 2, the inductor 38 and the capacitors 28 and 52 form a low pass LC filter network which serves to attenuate undesired radio frequency interference (RFI) in the 30 KHz to 30 MHz range. This bi-directional filtering not only prevents the introduction of source interference to the load, but also prevents the introduction of load generated interference to the source network. In normal mode flow as illustrated in FIG. 2, the low inductance requires fairly large capacitors in order to achieve the desired RFI suppression. However, since leakage current is not a safety concern in the normal mode flow, higher capacitor values can be used.

When a transient appears across the line 18 and neutral 22 source inputs to the circuit, the circuit suppresses the transient to prevent damage to the load. Within about 0.5 microseconds of the appearance of a transient, the gas arrester 26B switches from an open circuit condition to a short circuit condition, and the series combination of varistor and gas arrester absorbs a majority of the transient energy by diverting surge current across the AC main conductor pair back to the source of the transient. The impedance of the inductor 38, serves three separate purposes during a transient event. First, it insures that the path of least resistance for the transient is through the diverter stage. Second, it serves to dissipate a small portion of the energy contained in the transient, and third, it acts as a delay network to ensure that the diverter stage conducts before any significant, and potentially damaging, transient energy reaches the clamping stage.

Referring now to FIG. 3, line-ground common mode signal flow through the circuit is illustrated in simplified fashion. As is seen in reference to FIG. 2, a transient occurrence in common mode would be suppressed in an identical manner to that of a transient in normal mode, as discussed above. The only difference between the common mode signal path and normal mode signal path as described above is in the RFI filtering. Since leakage current must be controlled in common propagation modes, the combination of high common mode inductance with a lower valued or Y capacitor 76 is used to achieve the desired RFI suppression.

FIG. 4 illustrates in simplified fashion the signal flow path which would be seen by a common mode neutral-ground transient entering the circuit. The RFI filtering for this propagation mode is identical to that described in reference to FIG. 3. The main difference between this path is that there is no varistor 24 in the diverter stage. However, the series combination of the two gas arresters 26A and 26B are all that is necessary since the neutral and ground conductors are typically tied together at an AC junction box or similar source point. The voltage potential between these lines is therefore never more than a few volts, and thus power follow is not a problem.

When considered in the aggregate, FIGS. 2-4 illustrate an important feature of the invention. As can be seen, the circuit of the invention provides full protection of the load from both high energy transients and RFI in all signal propagation modes. In each mode, the load is protected by two non-linear devices in the diverter stage and four non-linear devices in the clamping stage. However, through a sharing of components, the circuit is not required to have six components for each propagation mode. Rather, full multi-mode protection is accomplished through the use of only eight non-linear devices, resulting in a significant saving both in size and cost versus the eighteen devices which would otherwise be necessary. Further, full filtering of undesired RFI is accomplished in all propagation modes.

Figure 5:
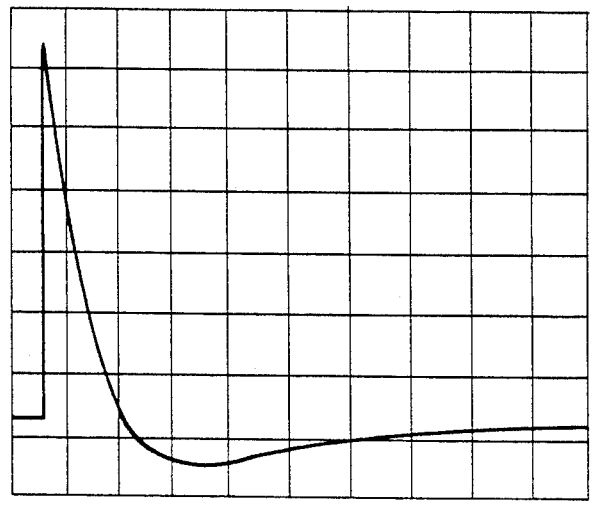
FIG. 5 is an oscilloscope trace showing the IEEE 587 Category B unipolar transient.

FIG. 5 is an oscilloscope trace of an IEEE 587 category B unipolar transient impulse. This impulse was applied to the circuit of FIG. 1 in the three propagation modes described above in reference to FIGS. 2-4. The circuit response to this impulse was measured at the output of the diverter stage and at the output of the clamping stage. The relative scale of these traces is indicated next to each in the drawing figures.

Figure 6A:
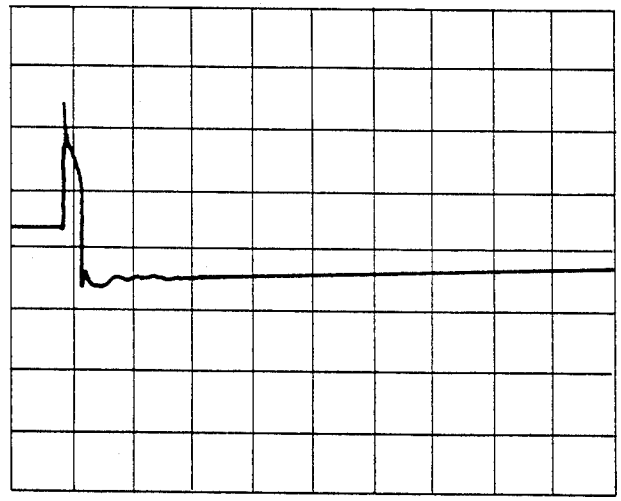
FIGS. 6A and 6B are oscilloscope traces showing the transient suppression characteristic of the circuit of FIG. 1 when subjected to an IEEE 587 Category B unipolar transient in the normal propagation mode.
Figure 6B:
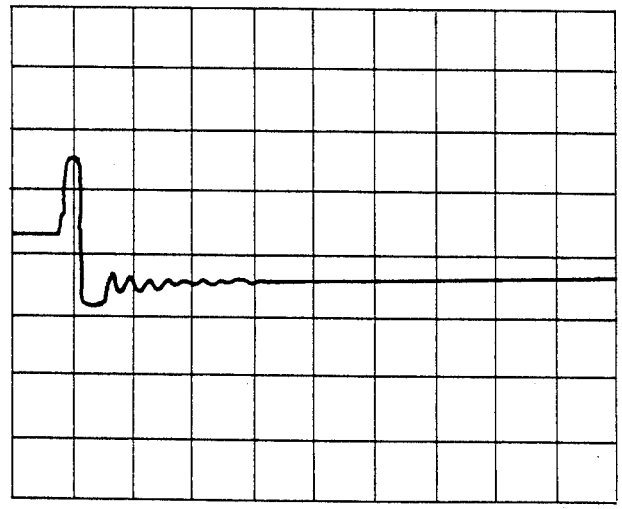

FIGS. 6A and 6B show the oscilloscope trace output for the circuit of the invention in response to the input impulse illustrated in FIG. 5 in the normal propagation mode. FIG. 6A, a trace taken at the output of the diverter stage, shows that the diverter stage reduced the magnitude of the impulse by more than 95%. FIG. 6B, taken at the output of the clamping stage, illustrates the full clamping of the transient overshoot seen in FIG. 6A.

Figure 7A:
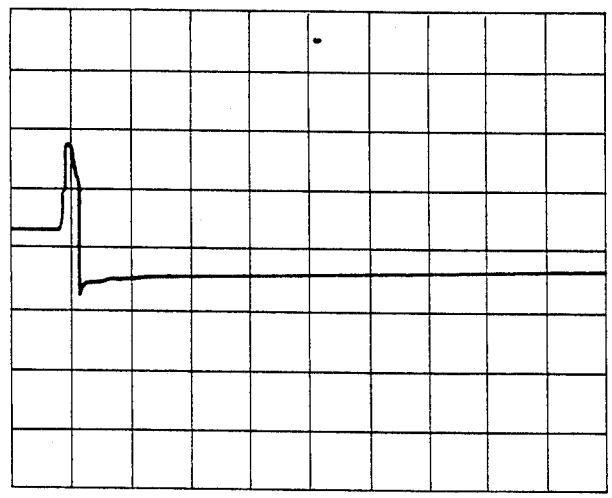
FIGS. 7A and 7B are oscilloscope traces showing the transient suppression characteristic of the circuit of FIG. 1 when subjected to an IEEE 587 Category B unipolar transient in the line-ground common propagation mode.
Figure 7B:
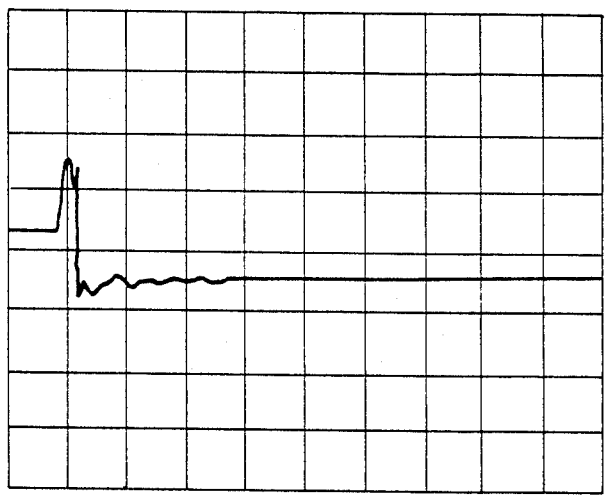

FIGS. 7A and 7B show the oscilloscope trace output for the circuit of the invention in response to the input impulse illustrated in FIG. S in the common line-ground propagation mode. FIG. 7A, a trace taken at the output of the diverter stage, shows that the diverter stage reduced the magnitude of the impulse by more than 95%. FIG. 7B, taken at the output of the clamping stage, illustrates the full clamping of the transient overshoot seen in FIG. 7A.

Figure 8A:
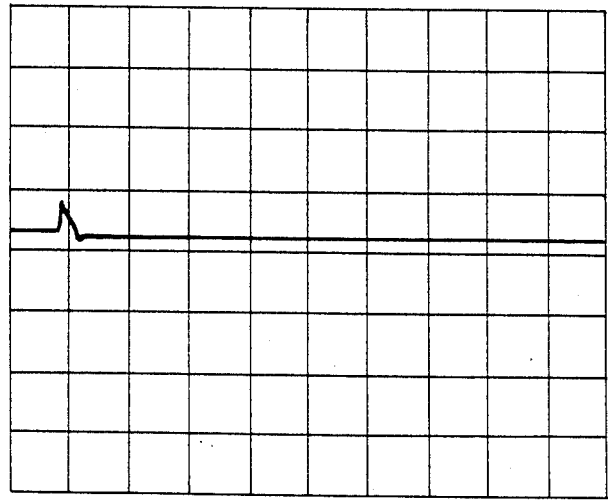
FIGS. 8A and 8B are oscilloscope traces showing the transient suppression characteristic of the circuit of FIG. 1 when subjected to an IEEE 587 Category B unipolar transient in the neutral-ground common propagation mode.
Figures 6, 8B:
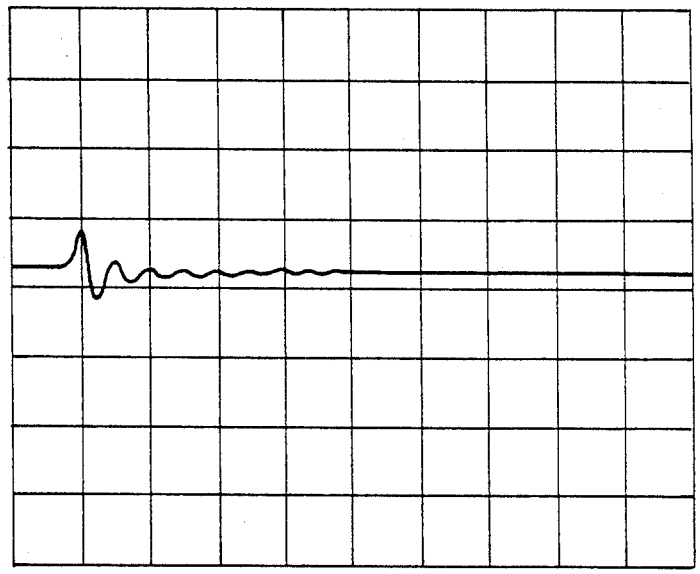

FIGS. 8A and 8B show the oscilloscope trace output for the circuit of the invention in response to the input impulse illustrated in FIG. 5 in the common neutral-ground propagation mode. FIG. 8A, a trace taken at the output of the diverter stage, shows that the diverter stage reduced the magnitude of the impulse by more than 96%. FIG. 8B, taken at the output of the clamping stage, illustrates the full clamping of the transient overshoot seen in FIG. 8A.

Figure 9:
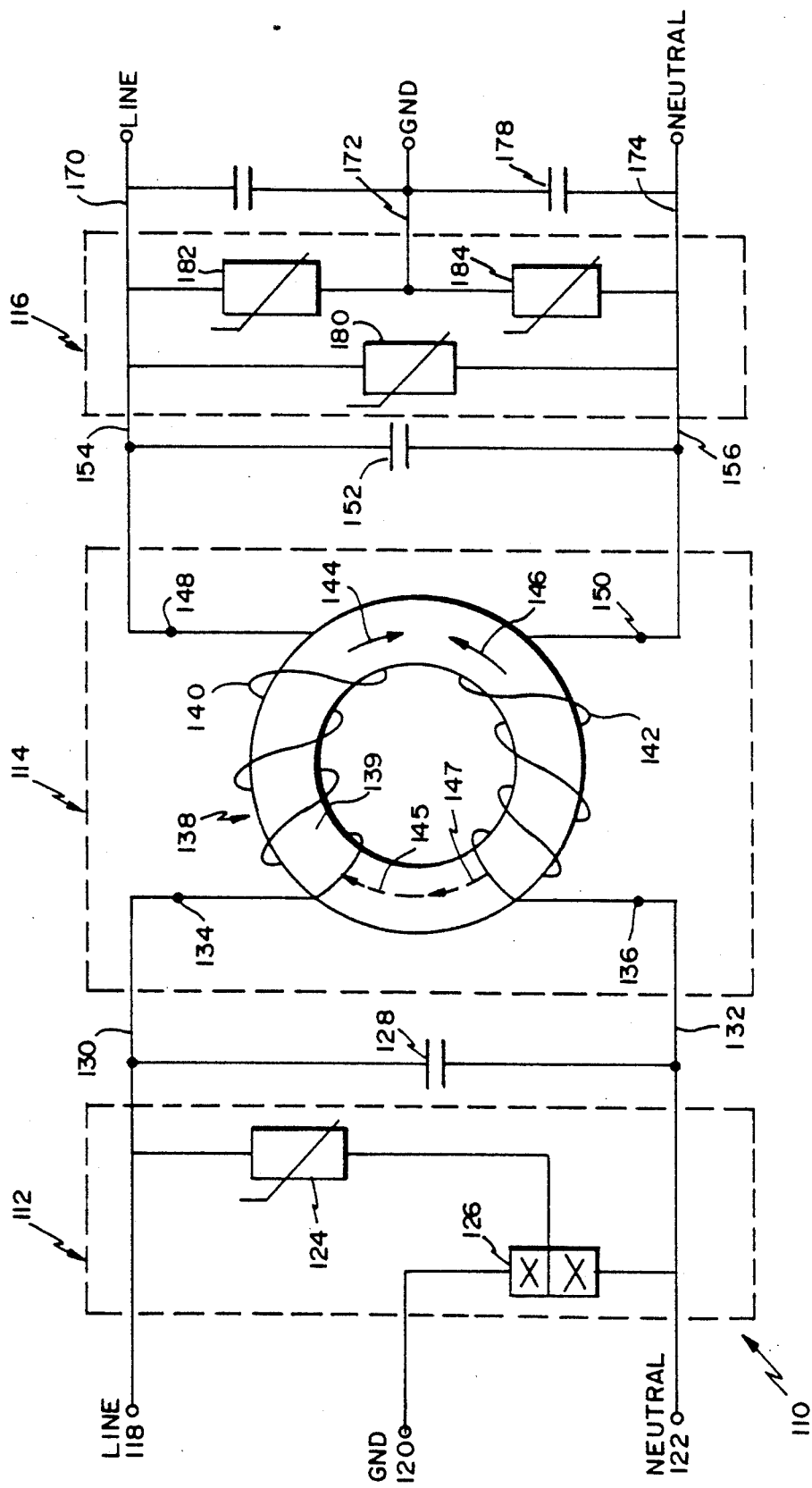
FIG. 9 is a detailed schematic drawing of a second embodiment of the EMI suppression device of the present invention.

A second embodiment of the electromagnetic interference suppression device of the invention, designated generally at 110, is shown in FIG. 9. The device 110 includes a diverter network 112, an impedance network 114 and a clamping network 116. In this embodiment, the input to the device is a single phase, three wire AC function having a line input 118, a safety ground 120 and a neutral return conductor 122.

As in the preferred embodiment, the diverter network 112 acts as the primary circuit protection in that it diverts or suppresses the majority of the incoming transient current between any two pairs of lines 118, 120 and 122 away from the clamping network 116. The clamping network 116 then serves to further reduce the transient energy by clamping any overshoot energy which may pass the diverter network 112. The clamping network 116 thus reduces any residual transient energy to levels that are within the transient limits of the protected equipment. Between the diverter network 112 and the clamping network 116, the impedance network 114 is included to force the bulk of the transient energy to be absorbed into the diverter network 112 and also to limit the residual transient energy to levels that can be absorbed without damage by the clamping network 116. The limiting impedance of the impedance network 114 has a very high impedance with respect to undesired transient frequencies and very low impedance with respect to desired power signal frequencies, typically 60 Hz.

Referring now in more detail to FIG. 9, it can be seen that the diverter network 112 is identical to that illustrated and described in reference to the preferred embodiment. The network 112 is identical in structure and function to that described in reference to FIG. 1.

Lines 130 and 132 of the diverter 112 are fed to the impedance network 114 across a parallel X2 capacitor 128. As in the preferred embodiment, the capacitor 128 is a type such as model PME271M660 manufactured by Evox/Rifa and having a value of 0.68 microfarads.

The lines 130 and 132 make a junction with the impedance network 14 at connections 134 and 136. Impedance network 114 includes a balun wound toroidal core inductor 138. This inductor is formed by two windings 140 and 142 of equivalent turns of magnetic wire on a magnetic toroidal core 139 in a balun configuration. In the device of FIG. 9, the windings 140 and 142 are wound on a high permeability powdered iron core 139 so that a large inductance is achieved with very few magnet wire turns, resulting in very low copper losses and a high steady state efficiency.

The output junctions 148 and 150 of the impedance network 114 are coupled to the clamping network 116 across a parallel X2 capacitor 152 via a pair of lines 154 and 156. The capacitor 152 is identical in type and value to X2 capacitor 128.

The clamping stage 116 includes three varistors, 180, 182 and 184 of a type such as model S10V S20K30 manufactured by General Semiconductor Industries.

Output lines 170, 172 and 174 of clamping stage 116 correspond to the device outputs line, ground and neutral. A Y capacitor 176 is connected across lines 170 and 172. Likewise, Y capacitor 178 is connected across lines 172 and 174. These Y capacitors 176 and 178 are of a type such as those manufactured by Evox/Rifa and having a nominal rating of 0.0022 microfarads.

Referring now in more detail to the impedance network 114, It should be understood that operation of this stage is identical to that described in reference to the preferred embodiment. The difference between the impedance network 114 and the impedance network 14 lies in the material of the core 139. In this embodiment, the core 139 is formed from powdered iron. Use of this material in forming the core of the inductance results in an impedance characteristic which is slightly less efficient that produced through the use of a ferrite core. However, there are significant cost savings achieved through the use of the powdered iron core.

Like the clamping network 16 of the preferred embodiment, the clamping stage 116 serves several purposes. First, it serves to clamp any transient overshoot which has bypassed the diverter stage 114 before that harmful energy can be delivered to the load. Second, the clamping stage acts to clamp transients which may occur at the load, such as spikes caused by catastrophic equipment failures and noisy equipment such as printers, so that those spikes are not introduced into the source network.

The network 116 utilizes an array of metal oxide varistors 180, 182 and 184 arranged such that one varistor is located between each combination of the line, neutral and ground output lines. In particular, varistor 180 is connected between the line and neutral outputs; varistor 182 is connected between the line and ground outputs; and, varistor 184 is connected between the neutral and ground outputs. The use of varistors in the clamping network 116 is less desirable than using silicon avalanche diodes as described in reference to the preferred embodiment. The detrimental effect of using varistors instead of diodes in this stage is two-fold; first, the clamping response time of the varistor array is approximately 25,000 times slower than that of the avalanche diode arrangement. Second, the varistors have a higher voltage clamp level, typically 310 volts maximum, resulting in slightly increased levels of transient passage to a protected device.

In spite of its reduced component costs, the invention of FIG. 9 is an effective interference suppression device. The high efficiency of the diverter stage 112 allows for a slightly less stringent criteria to be applied to the performance of the clamping stage 116. Likewise, the filtering characteristics of the circuit are only marginally affected by the change from a ferrite core to a powdered iron core in the impedance network. The device of FIG. 9 is thus a low-cost, high performance suppression circuit.

While the foregoing detailed descriptions of the preferred embodiments illustrate the invention in great detail, it will be understood by those skilled in the art that many variations of the device can be made without departing from the scope of the invention. For example, while the description relates only to 120 V North American Standard source supplies, it is clear that the invention can be adapted to operate at any source voltage. For example, in higher power systems, a higher voltage varistor may be used to prevent power follow problems. Further, in applications where clamp levels as low as 250 volts are not necessary, such as in primary panel protection, a higher voltage varistor can be used in the diverter stage.

Likewise, many devices such as indicator lights, thermal breakers, and the like can be easily incorporated into the described embodiments, as is well known in the art, without departing from the invention.

It should be understood that the foregoing description of the preferred embodiments is illustrative only and that the invention may take many forms without departing from the spirit of the invention.

What is claimed is:

1. A circuit for controlling transient energy and for controlling radio frequency interference, said circuit comprising:
   line, neutral and ground input terminals for connection to a power source;
   line, neutral and ground output terminals for connection to a load;
   diverter means connected to said input terminals for suppressing transient energy appearing at the input terminals, said diverter means having a gas arrester and a varistor in series between the line and neutral input terminals and between the line and ground input terminals;
   clamping means connected to said output terminals for suppressing any overshoot of transient energy which is not suppressed by the diverter means, said clamping means having silicon avalanche diode sin series between the line and neutral output terminals and between the line and ground output terminals; and
   filtering means connected to said diverter means and said clamping means for limiting passage of radio frequency interference through the circuit.

2. The invention as claimed in claim 1 wherein said diverter means includes two gas arresters in series between said neutral and ground input terminals.

3. The invention as claimed in claim 1 wherein said gas arrester is a three terminal device having first, second and third leads electrically connected respectively to said line, ground and neutral input terminals.

4. The invention as claimed in claim 1 wherein said clamping means includes:
   four silicon diodes in series between said line and neutral output terminals;
   four silicon diodes in series between said line and ground output terminals; and,
   four silicon diodes in series between said neutral and ground output terminals.

5. The invention as claimed in claim 1 wherein said filtering means includes a first Y capacitor between said line and ground output terminals and a second Y capacitor between said neutral and ground output terminals.

6. The invention as claimed in claim 1 wherein said filtering means includes a balun wound toroidal core inductor.

7. The invention as claimed in claim 5 wherein said filtering means includes at least one X capacitor between said line and neutral input terminals, and at least one X capacitor between said line and neutral output terminals.

8. A system for protecting electrical loads from transient overvoltages occurring in its source network comprising:
   line, neutral and ground inputs having terminals for connection to the source network;
   a first circuit from said line input to said neutral input;
   a second circuit from said line input to said ground input;
   a third circuit from said neutral input to said ground input;
   a varistor in each of said first and second circuits and having open circuit and short circuit conditions;
   a gas arrester in each of said first, second and third circuits and having open circuit and short circuit conditions;
   said first circuit defining a normal mode transient overvoltage suppression path when said varistor and said gas arrester are in a short circuit condition;
   said second circuit defining a first common mode transient overvoltage suppression path when said varistor and said gas arrester are in a short circuit condition; and,
   third circuit defining a second common mode transient overvoltage suppression path when said gas arrester is in a short circuit condition.

9. The invention as claimed in claim 8 wherein the gas arrester includes three leads electrically connected to said terminals.

10. The invention as claimed in claim 9 wherein a first of said leads is connected to said neutral input, a second of said leads being connected to said ground input terminal and a third of said leads being connected to a first varistor lead.

11. The invention as claimed in claim 10 wherein a second varistor lead is connected to said line input.

12. An electromagnetic interference suppression device for controlling transient energy and for controlling radio frequency interference, said device comprising:
   line, neutral and ground input terminals for connection to a power source;
   line, neutral and ground output terminals for connection to a load;
   diverter means connected to said input terminals for suppressing transient energy spikes appearing at the input terminals, said diverter means having a gas arrester array whereby a gas arrester and a varistor are in series between the line and neutral input terminals, a gas arrester and a varistor are in series between the line and ground input terminals, and two gas arresters are in series between said neutral and ground input terminals;
   clamping means connected to said output terminals for suppressing any overshoot of transient energy which is not suppressed by the diverter means, said clamping means having an array of six silicon avalanche diodes whereby four of said diodes are in series between said line and neutral output terminals, four of said diodes are in series between said line and ground output terminals and, four of said diodes are in series between said neutral and ground output terminals; and filtering means connected to said diverter means and said clamping means for limiting passage of radio frequency interference through the device, said filtering means having a first Y capacitor between said line and ground output terminals, a second Y capacitor between said neutral and ground output terminals, an X capacitor between said line and neutral input terminals, an X capacitor between said line and neutral output terminals, and a balun wound toroidal core inductor electrically connected between said diverter means and said clamping means.

13. The invention as claimed in claim 12 wherein said gas arrester array is a three terminal gas arrester having first, second and third leads electrically connected respectively to said line, ground and neutral input terminals.

14. A circuit for controlling transient energy and for controlling radio frequency interference, said circuit comprising:

line, neutral and ground input terminals for connection to a power source;

line, neutral and ground output terminals for connection to a load;

diverter means connected to said input terminals for suppressing transient energy spikes appearing at the input terminals, said diverter means having a gas arrester and a varistor in series between the line and neutral input terminals and between the line and ground input terminals;

clamping means connected to said output terminals for suppressing any overshoot of transient energy which is not suppressed by the diverter means, said clamping means having metal oxide varistors between the line and neutral output terminals and between the line and ground output terminals and between the neutral and ground output terminals; and filtering means connected to said diverter means and said clamping means for limiting passage of radio frequency interference through the circuit.

15. The invention as claimed in claim 14 wherein said diverter means includes two gas arresters in series between said neutral and ground input terminals.

16. The invention as claimed in claim 14 wherein said gas arrester is a three terminal device having first, second and third leads electrically connected respectively to said line, ground and neutral input terminals.

17. The invention as claimed in claim 14 wherein said filtering means includes a first Y capacitor between said line and ground output terminals and a second Y capacitor between said neutral and ground output terminals.

18. The invention as claimed in claim 14 wherein said filtering means includes a balun wound toroidal core inductor.

19. The invention as claimed in claim 18 wherein said filtering means includes at least one X capacitor between said line and neutral input terminals, and at least one X capacitor between said line and neutral output terminals.

* * * * *